United States Patent [19]

Hoffman

[11] Patent Number: 4,486,859
[45] Date of Patent: Dec. 4, 1984

[54] ELECTRICALLY ALTERABLE READ-ONLY STORAGE CELL AND METHOD OF OPERATING SAME

[75] Inventor: Charles R. Hoffman, Raleigh, N.C.

[73] Assignee: International Business Machines Corporation, Armonk, N.Y.

[21] Appl. No.: 350,530

[22] Filed: Feb. 19, 1982

[51] Int. Cl.³ ............................................. G11C 11/40
[52] U.S. Cl. ..................................... 365/185; 365/218
[58] Field of Search ................................ 365/185, 218

[56] References Cited

U.S. PATENT DOCUMENTS

| 4,051,464 | 9/1977 | Huang | 365/185 |
| 4,185,319 | 1/1980 | Stewart | 365/185 |
| 4,314,265 | 2/1982 | Simko | 365/185 |
| 4,357,685 | 11/1982 | Daniele et al. | 365/185 |
| 4,434,478 | 2/1984 | Cook et al. | 365/185 |

OTHER PUBLICATIONS

IEEE Trans. on Elec. Devices, vol. ED-28 No. 9, Sep. 1981, pp. 1047-1053, D. J. DiMaria et al., "Dual-Electron-Injector-Structure . . .".
Electronics, Feb. 28, 1980, pp. 113-117, Johnson et al., "16-K EE-PROM Relies on Tunneling for Byte-Erasable Program Storage".
IEEE Journal of Solid-State Circuits, vol. SC-15, No. 3, Jun. 1980, B. Giebel, An 8K EEPROM Using the SIMOS Storage Cell.
IEEE Journal of Solid-State Circuits, vol. SC-15, No. 3, Jun. 1980, T. Hagiwara et al., "A 16 Kbit Electrically Erasable PROM . . .".
IEEE Trans. on Electron Devices, vol. ED-26, No. 4, Apr. 1979, D. Guterman et al., "An Electrically Alterable Nonvolatile . . .".
ISSCC 77/Feb. 18, 1977, FAM 15.5: Electrically Alterable 8192 Bit N-Channel . . . Muller et al.
Electronics, Dec. 9, 1976, "An Electrically Alterable ROM and It Doesn't Use Nitride" J. Kelley et al.

Primary Examiner—James W. Moffitt
Attorney, Agent, or Firm—Edward H. Duffield

[57] ABSTRACT

A non-volatile EAROS (Electrically Alterable Read Only Storage) memory array with fast reading and writing capability and a minimized cell size. Each cell of the array is composed of a floating gate first FET and a standard second FET connected in series between a reading bit line and a programming bit line for the row in which the cell is located. The floating gate of the first FET is connected through a capacitor to the common connection point between the first and second FET. DEIS (Dual Electron Injection Stack) material is used for the dielectric of a capacitor lying above the floating gate of the first FET. In programming the cell, a positive charge is stored on the floating gate of the first FET. When the cell is erased, the charge on the floating gate is reduced to zero, or at most a small negative charge. Because no large negative charge is stored on the floating gate, the voltages which can be applied to the diffusions of the cell are reduced, and thereby the cell area is correspondingly reduced.

9 Claims, 13 Drawing Figures

ELECTRICALLY ALTERABLE READ-ONLY STORAGE CELL AND METHOD OF OPERATING SAME

BACKGROUND OF THE INVENTION

The invention pertains generally to semiconductor memory devices. Specifically, the invention pertains to a nonvolatile type ROM (Read Only Memory) composed of a number of memory cells arranged in rows and columns. Yet more particularly, the invention pertains to a ROM of this type which utilizes a floating gate FET for providing a non-volatile storage function. Devices of the general type to which the invention pertains are known as EAROS (Electrically Alterable Read Only Storage) memories.

In an EAROS memory of this general type, charge stored on a floating gate of an FET of each memory cell is used to represent a logic level, that is, a data 1 or 0. When a particular cell of the memory is addressed, the state of the charge on the floating gate determines whether or not the channel of the FET of which the floating gate forms a part is conductive, and hence the amount of current which flows through the selected cell.

A number of techniques are known for transferring charge to and from a floating gate. (As utilized herein, charging of the floating gate is referred to as "programming" and the removal of charge from the floating gate is referred to as "erasing".) In "An Electrically Alterable ROM and It Doesn't Use Nitride", J. W. Kelley et al., *Electronics*, Dec. 9, 1976, p. 101 ff., there is described a ROM in which programming is achieved using avalanche electron injection and erasing with avalanche hole injection. R. G. Muller et al. in "Electrically Alterable 8192 Bit N-Channel MOS PROM", *ISSCC Proceedings*, February 1977, p. 188 ff., describe a device utilizing "hot" electron injection for programming and Fowler-Nordheim emission for erasing. U.S. Pat. No. 4,119,995, issued Oct. 10, 1978, to Simko and D. Guterman et al. and "An Electrically Alterable Nonvolatile Memory Cell Using a Floating Gate Structure", *IEEE JSSC*, April 1979, p. 498 ff., disclose memories utilizing hot electron injection for programming and oxide conduction (tunneling) for erasing. U.S. Pat. No. 4,099,196, issued July 4, 1978, to Simko teaches a memory cell utilizing oxide conduction for both programming and erasing.

All of these approaches suffer from a common drawback in that, in each case, a relatively large negative charge is stored on the floating gate. Due to the negative charge on the floating gate, there is a lower limit to the cell size and hence a limit to the cell density which can be achieved.

To understand this problem, it may be seen that the breakdown voltage $BV_{N-P}$ of an N+P junction of the transistor of a memory cell is determined by:

$$BV_{N-P} = MV_{FG} + BV_{FG}(0).$$

(See, for instance, *Physics and Technology of Semiconductor Devices*, A. S. Grove, c. 10, Wiley, November 1967). In this equation, $V_{FG}$ is the floating gate voltage, M is a constant close to unity, and $BV_{FG}(0)$ is the zero gate breakdown voltage.

To scale down the size of a device and achieve a desired cell density, the doping levels and junction depths of each transistor of each cell must be correspondingly scaled down thereby resulting in a reduction of the term $BV_{FG}(0)$. A negative charge transferred to the floating gate during programming causes the term $V_{FG}$ to be negative. From the above-stated equation, it may readily be appreciated that reducing the term $V_{FG}$ reduces the maximum allowable voltage that can be applied to the N+P junctions and N+ diffusions of the transistors of the memory cells. Hence, in the memory cells of the prior art memories discussed above, due to the negative charge on the floating gate, a lower limit to the cell size must be imposed so that breakdown does not occur.

Other examples of memory cell structures in which this same problem is present are described in Johnson et al., "16K EE-PROM Relies on Tunneling for Byte Erasable Program Storage", *Electronics*, Feb. 28, 1980, and in U.S. Pat. No. 4,209,849, issued July 24, 1980 to Schrenk. In the memory cells disclosed therein, a capacitor formed between polysilicon conductors which has a relatively high capacitance compared to the capacitance of a capacitor between the lower polysilicon conductor (which forms a floating gate) and the substrate of the device. Such a high capacitive ratio is necessary to achieve a sufficiently large electric field across the latter capacitor during programming and erasing. The cell size in both cases is limited by the relatively large size of the larger capacitor.

Giebel, "An 8K EEPROM Using the Simos Storage Cell", *IEEE JSSC*, June 1980, describes a memory cell in which a floating gate is programmed by hot electron injection and erased using FowlerNordheim tunneling through a thin oxide region, similar to the case of the above-mentioned article by Muller et al. This technique requires a considerably high power dissipation during programming and erasing, and hence is considered less desirable than the approach used in the Johnson et al. publication or in U.S. Pat. No. 4,209,849 to Schrenk. Moreover, the technique used by Giebel requires that programming and erasing occur at different positions in the FET gate region of the device. This results in charge carrier trapping at the two separated locations with no opposing fields which would create detrapping, thus making this approach additionally disadvantageous.

Hagiwara et al. in "A 16K bit Electrically Erasable PROM Using N-Channel Si-Gate MNOS Technology", *IEEE JSSC*, June 1980, describe a nonvolatile memory cell using a metal-nitride-oxide-semiconductor (MNOS) structure (which represents a different technology or technique than the floating gate structures utilized by the present invention and the prior art devices discussed above). In general, the data retention capabilities of an MNOS device are not as good as those of a floating gate device. In addition, it is not possible to fabricate an MNOS device using techniques commonly used for producing standard high speed logic devices. Thus, if it is desired to integrate an MNOS device with a device such as a microprocessor fabricated using standard high speed logic techniques, serious manufacturing problems are encountered.

A non-volatile random access memory fabricated on a single silicon chip is disclosed in "Dual-Electron Injector-Structure Electrically Alterable Read-Only Memory Model Studies", DiMaria et al., *IEEE Transactions on Electron Devices*, Vol. ED-28, No. 9, September 1981, and in copending patent application Ser. No. 124,003, filed Feb. 26, 1980, which is assigned in common with the present application. This memory device uses a cell structure composed of an n-channel MOS transistor with DEIS (Dual Electron Injector Stack) material positioned between a control gate and a "floating" polycrystalline silicon gate. Writing is performed by applying a negative voltage to the control gate. This negative voltage causes the injection of electrons from the top silicon-rich $SiO_2$ injector layer of the DEIS material to the floating polysilicon layer. Similarly, erasing is performed by applying a positive voltage to the control gate, which then injects electrons from a bottom silicon-rich $SiO_2$ injector layer of the DEIS material to the floating polysilicon layer.

Other examples of memory cells using a floating gate FET with charge transferred to the floating gate through DEIS material or the like are disclosed in copending U.S. patent application Ser. Nos. 192,579, filed Sept. 30, 1980 now U.S. Pat. No. 4,388,704; 192,580, filed Sept. 30, 1980 now U.S. Pat. No. 4,399,522; and 219,285, filed Dec. 22, 1980 now U.S. Pat. No. 4,363,110.

It is an object of the present invention to provide a memory composed of non-volatile cells which does not suffer from any of the drawbacks enumerated above.

Specifically, it is an object of the invention to provide such a memory device in which the cell size can be reduced beyond that provided by prior art techniques.

Yet further, it is an object of the present invention to provide such a memory cell in which the breakdown voltages are reduced and in which programming and erasing can be achieved utilizing relatively low voltages.

SUMMARY OF THE INVENTION

These, as well as other objects of the invention, are met by a memory array having memory cells each including a floating gate FET in which the programming of the floating gate is achieved with a positive charge. With the use of a positive programming charge, there is no reduction in the breakdown voltage, and hence in the voltage which can be applied to the N+ diffusions of the transistor.

Specifically, in accordance with the invention, there is provided a memory array having a word line and first and second bit lines provided for each column and row, respectively, within the array. Each cell of the array is composed of a floating gate FET connected in series with a standard single gate FET between the two bit lines for the row in the array in which the cell is located. A first capacitor is formed between the floating gate of the floating gate transistor and its substrate while a second capacitor is formed between the floating gate and an electrode connected to a programming control line which is connected in common to each of the cells of the array. A third capacitor is coupled between the floating gate and the drain of the floating gate transistor and also the source of the standard FET. The gate of the standard FET is coupled to the word line for the column in which the cell is located.

DEIS material is utilized for the dielectric material of the second capacitor. Programming of the floating gate is achieved by turning on the standard FET and applying a current through the series combination of the second and third capacitors, flowing between the control line and the programming bit line. In the memory cell thus constructed, a positive charge is used to program the floating gate.

DESCRIPTION OF THE PREFERRED EMBODIMENTS

Figure 1:
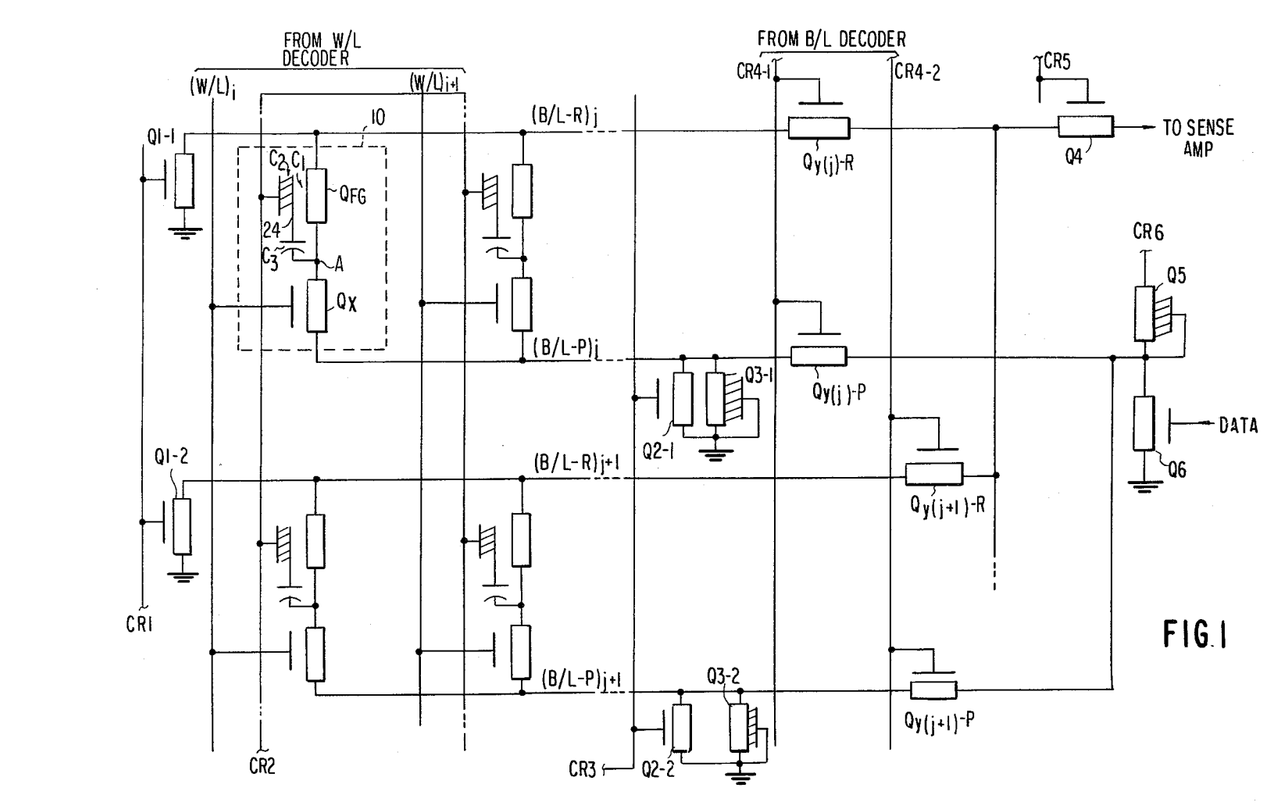
FIG. 1 is a circuit diagram of a memory array constructed in accordance with the invention.

Referring now to FIG. 1, there is shown a schematic diagram of a portion of a memory array constructed in accordance with the teachings of the present invention. The portion of the memory array shown in FIG. 1 includes four memory cells 10 of identical construction arranged two in each of two columns and rows. Of course, in a practical embodiment, many more memory cells would be provided.

The memory cells are arranged in rows and columns in X and Y directions, respectively. For each row, a reading bit line $(B/L-R)_j$, $(B/L-R)_{j+1}$, . . . and a programming bit line $(B/L-P)_j$, $(B/L-P)_{j+1}$, . . . are provided, while for each column, a single word line $(W/L)_i$, $(W/L)_{i+1}$, . . . is provided.

The memory cell 10 indicated in the upper left-hand portion of the drawing will now be discussed. However, the structure and operation of all of the memory cells of the array is identical therewith.

The memory cell 10 is composed of a floating gate FET $Q_{FG}$ and a standard FET $Q_X$ connected in series with the source of the transistor $Q_{FG}$ connected to the reading bit line $(B/L-R)_j$, the drain of the transistor $Q_{FG}$ connected to the source of the transistor $Q_X$, and the drain of the transistor $Q_X$ connected to the programming bit line $(B/L-P)_j$. The gate of the transistor $Q_X$ is connected to the word line $(W/L)_i$.

Two capacitors $C_1$ and $C_2$ are formed on either side of the floating gate of the transistor $Q_{FG}$, the capacitor $C_1$ being formed between the floating gate 24 and the channel in the substrate of the transistor $Q_{FG}$ and the capacitor $C_2$ being formed between the floating gate 24 and an upper or control electrode which is connected to a control line CR2. The dielectric of the capacitor $C_2$ is at least partially formed with DEIS material. A third capacitor $C_3$ is connected between the floating gate 24 and the interconnected drain and source of the transistors $Q_{FG}$ and $Q_X$, respectively.

The reading bit line $(B/L-R)_j$ is connected through a bit line activating transistor $Q_{y(j)}R$ and a transistor Q4 to a sense amplifier, while the programming bit line $(B/L-P)_j$ is connected through a transistor $Q_{y(j)}$-P to a data driver circuit composed of a depletion mode transistor Q5 and an enhancement mode transistor Q6.

Parallel-connected transistors Q2-1 and Q3-1 are connected between the programming bit line (B/L−P)$_j$ and ground, the transistor Q2-1 being an enhancement mode device and the transistor Q3-1 being a depletion mode device. The gate of the transistor Q3-1 is connected to ground and the gate of the transistor Q2-1 is connected to a third control line CR3.

The reading bit line (B/L−R)$_j$ is also connected to ground through an enhancement mode transistor Q1-1, the gate of which is connected to a control line CR1. Another control line CR4-1 is connected to the gates of both of the transistors Q$_{y(j)}$-R and Q$_{y(j)}$-P, a control line CR5 is connected to the gate of the transistor Q4, and a control line CR6 to the source of the transistor Q5 in the data driver circuit.

Figure 2:
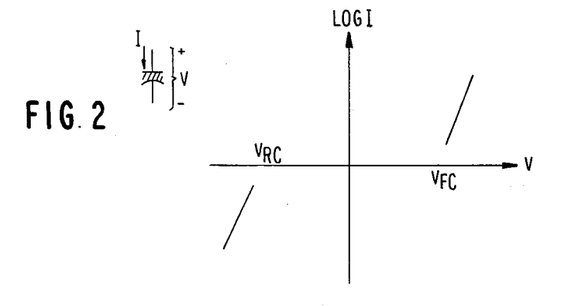
FIG. 2 is a graph showing a log I-V characteristic curve of DEIS material used for the dielectric of a capacitor of a memory cell of the memory array of FIG. 1.

Referring now to FIG. 2, there is shown therein a log I - V characteristic curve of the DEIS material which forms the dielectric of the capacitor C$_2$. When the voltage across the DEIS material falls between the reverse conducting voltage V$_{RC}$ and the forward conducting voltage V$_{FC}$, no current will flow therethrough and the DEIS material behaves as a very good insulator. Outside of the voltage range between V$_{RC}$ and V$_{FC}$, the DEIS material is conductive with a resistance dependent upon the magnitude of the applied voltage.

The operation of the memory array shown in FIG. 1 will now be described.

In the erase mode, the control lines CR1 and CR3 are activated to turn on the transistors Q1-1 and Q2-1 to thereby ground both the reading bit line (B/L−R)$_j$ and the programming bit line (B/L−P)$_j$. The control line CR2, which functions as a program/erase control line, is taken to a high positive voltage, for instance, in a range of 20 to 24 volts. The capacitive coupling to the floating gate 24 through the capacitor C$_2$ in this case causes the floating gate transistor Q$_{FG}$ to turn on, thereby grounding the node A independent of the conductive state of the transistor Q$_X$. All word lines except the word line (W/L)$_i$ for the column which is addressed are in the off or data 0 state. The word line (W/L)$_i$ corresponding to the cells in the addressed column is in an on or data 1 state so that the transistor Q$_X$ is on and the mode A thus held to ground through both the transistor Q$_{FG}$ and the transistor Q$_X$.

Figure 3:
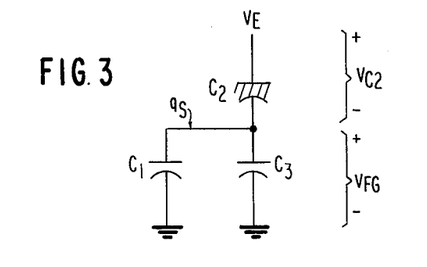
FIG. 3 is an equivalent circuit of the memory cell of FIG. 1 for an erase operation.

For the described conditions in the erase mode, an equivalent circuit of the capacitor network for the memory cell 10 is shown in FIG. 3. It may readily be shown that the voltage V$_{C2}$ across the capacitor C$_2$ is:

$$V_{C2}=((C_1+C_3)V_E-q_S),/C_1+C_2+C_3.$$

where q$_s$ is the charge on the floating gate. Similarly, the voltage V$_{FG}$ of the floating gate, relative to ground, is:

$$V_{FG}=(C_2V_E+q_S)/C_1+C_2+C_3.$$

Solving for the charge stored on the floating gate:

$$q_S=(C_1+C_3)V_E-(C_1+C_3)V_{FC}.$$

By proper choice of the capacitance values and the applied voltage, any desired erase charge can be stored on the floating gate. The erased state results in a positive charge on all floating gates.

In the programming mode, both of the transistors Q1-1 and Q4 are turned off by grounding the control lines CR1 and CR5. This causes the reading bit line (B/L−R)$_j$ to float. The transistor Q2-1 is turned off by grounding the control line CR3. However, the programming bit line (B/L−P)$_j$ is lightly pulled to ground via the low current source formed by the depletion mode transistor Q3-1. The program/erase control line CR2 is held at a negative voltage, for instance, in a range of −8 to −10 volts. The bit line decoder is then set to turn on the transistors Q$_{y(j)}$-R and Q$_{y(j)}$-P, whereupon the programming bit line (B/L−P) is controlled by the incoming data impressed upon the gate of the transistor Q6. In this case, the control line CR6 is taken to a relatively high programming voltage V$_{PP}$. If the data is in the data or logic 1 state, the voltage V$_{PP}$ is routed to one side of the capacitor C$_3$ through the transistor Q$_X$. Otherwise, if the data is in the 0 state, the side of the capacitor C$_3$ connected to the transistor Q$_X$ is grounded.

Figures 4, 5:
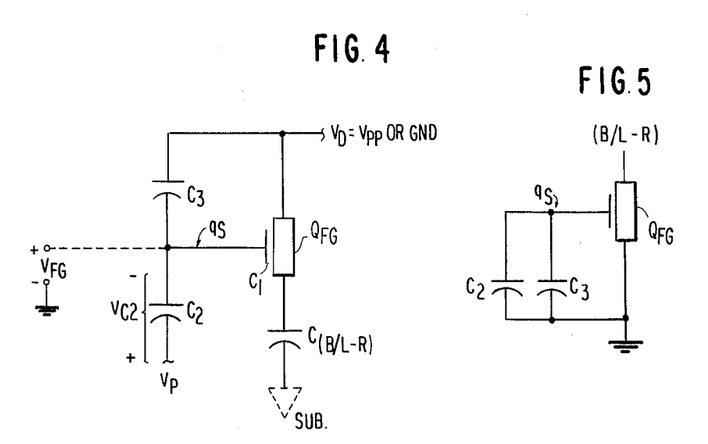
FIG. 4 is an equivalent circuit diagram of the memory cell of FIG. 1 for a programming operation.
FIG. 5 is an equivalent circuit diagram of the memory cell of FIG. 1 for a read operation.

For the cell 10 so selected in the programming mode, the equivalent circuit is shown in FIG. 4. At the start of the programming operation, the stray capacitance of the reading bit line (B/L−R)$_j$ will be charged to a voltage equal to an FET threshold voltage below the level of the floating gate voltage. As the second capacitor C$_2$ begins to conduct, the floating gate voltage V$_{FG}$ falls at a faster rate than the rate of leakage discharge of the stray capacitance of the reading bit line (B/L−R)$_j$. Due to this fact, the capacitor C$_1$ has very little effect on the current flowing between the program/erase control line CR2 and the programming bit line (B/L−P)$_j$ through the transistor Q$_X$, and hence only the capacitance values of the capacitors C$_2$ and C$_3$ are significant at this time. At the end of the programming operation, the charge on the floating gate 24 will be a value q$_{S-1}$ for a data 1 and q$_{S-0}$ for a data 0.

In the reading mode, as depicted by the FIG. 5 which is an equivalent circuit diagram of the memory cell of FIG. 1 for a read operation, the word line (W/L)$_i$ is set to a positive voltage to cause the transistor Q$_X$ to be conductive to thereby ground one side of the capacitor C$_3$ and the source of the floating gate transistor Q$_{FG}$, as the transistor Q2-1 is grounded due to activation of the control line CR3. The control line CR4-1 is also activated to turn on the transistors Q$_{y(j)}$-R and Q$_{y(j)}$-P to thereby connect the reading bit line (B/R−R)$_j$ to the sense amplifier through the transistor Q4. The control line CR5 is also at that time taken positive.

The program/erase control line CR2 is grounded during the reading operation. Thus, the voltage of the floating gate 24 is determined by the amount of the charge q$_S$ stored thereon. For a floating gate charge of q$_{S-i}$, the floating gate transistor Q$_{FG}$ will be off, thereby presenting an open circuit to the bit line sense amplifier through the transistors Q$_{y(j)}$-R and Q4. On the other hand, for a floating gate charge of q$_{S-0}$, the floating gate transistor Q$_{FG}$ is turned on to thereby ground the reading bit line (B/L−R)$_j$. By attempting to pass a sense current through the bit line (B/L−R)$_j$, the sense amplifier, is able to determine the state of the charge stored on the floating gate 24 from the resistance of the channel of the transistor Q$_{FG}$, and hence the state of the data stored in the memory cell 10.

Referring now to the sequence of diagrams shown in FIGS. 6A-6E, the fabrication of a cell of the memory array shown in FIG. 1 will now be described. FIG. 7 is a circuit diagram of the memory cell 10 of FIG. 1 with reference numerals added to correlate it with the diagrams of FIGS. 6A–6E.

Figure 6A:
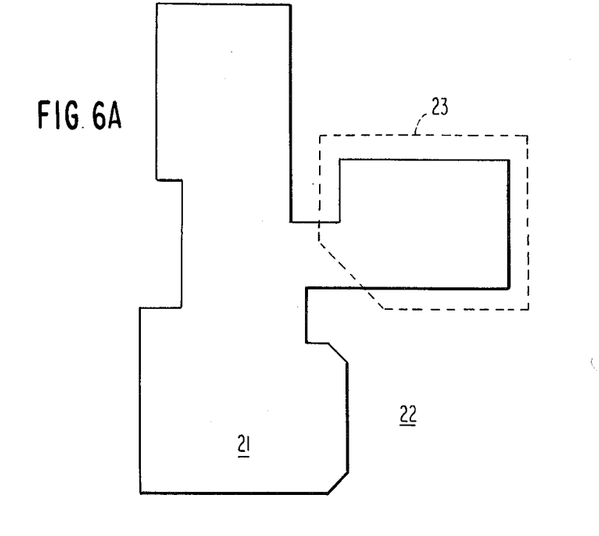
FIGS. 6A-6E are a series of top views showing the construction of a cell of the memory array of FIG. 1.
Figure 7:
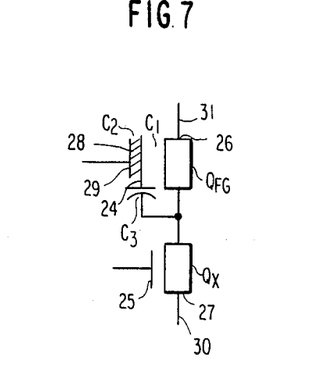
FIG. 7 is a schematic diagram of the memory cell of FIG. 1 with reference numerals added thereto to indicate correspondence with the view of FIGS. 6A-6E.

First, as shown in FIG. 6A, the cell area is defined by a layer 22 of recessed oxide which is opened in an area 21 to define the active area of the cell. The recessed oxide layer 22 serves to isolate the cell from the other cells within the array. Following the formation of the recessed oxide layer 22, a special diffusion is performed through a mask within an area 23. The purpose of this special diffusion, which may be performed by an ion implantation technique, is to form the lower plate of the capacitor $C_3$. After depositing and etching a layer of oxide in the appropriate areas, polysilicon layers 24 and 25 are deposited to form the floating gate (24) of the floating gate transistor $Q_{FG}$ and the gate of the transistor $Q_X$ (25). The polysilicon layer 25 which forms the gate of the FET $Q_X$ extends outside of the cell to connect to the corresponding word line.

Figure 6B:
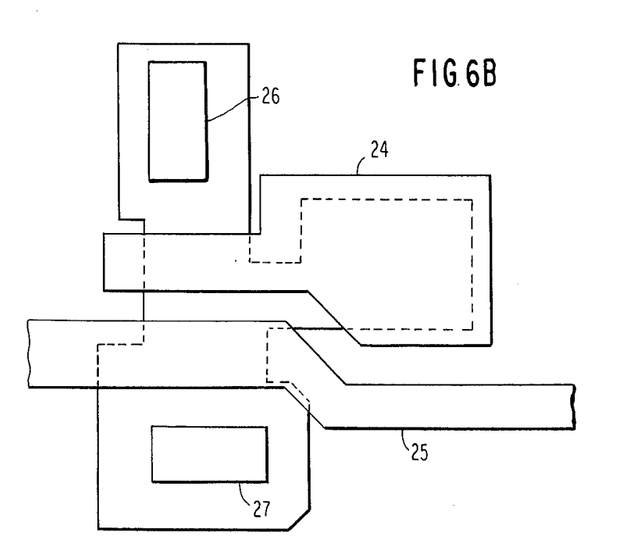

The open area 21 not covered by polysilicon is later ion implanted to form the source diffusion 26 of $Q_{FG}$, the drain diffusion 27 of $Q_X$ and the common portion of $Q_{FG}$ and $Q_X$.

Figure 6C:
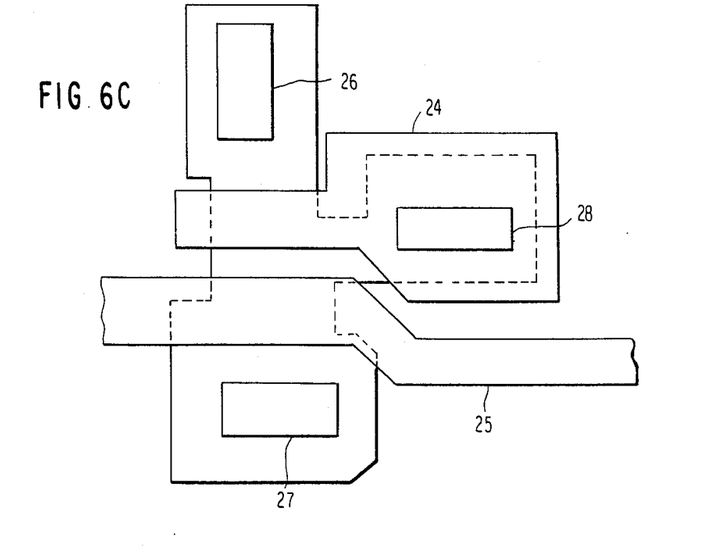
Figure 6D:
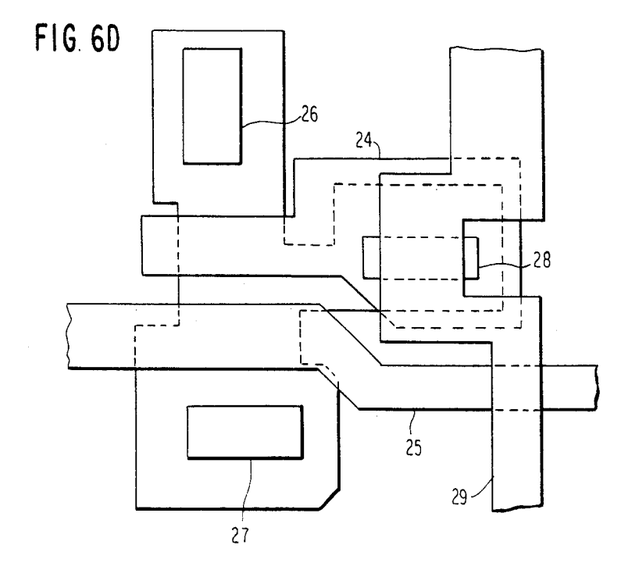

Following this, as shown in FIG. 6C, a segment 28 of DEIS material is formed atop the floating gate layer 24. As shown in FIG. 6D, contact to the upper surface of the DEIS segment 28 is made through a polysilicon layer 29 which is next deposited. The polysilicon layer 29 extends off the cell to make contact to the control line CR2.

Figure 6E:
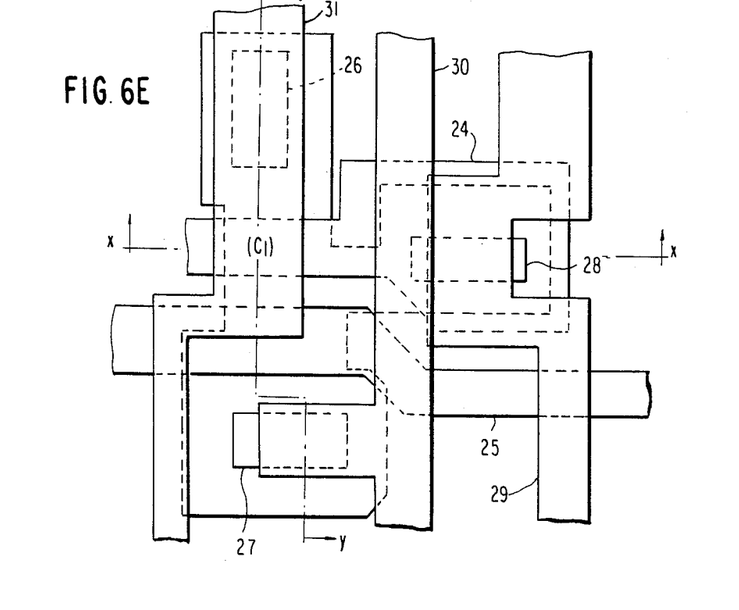
Figure 8:
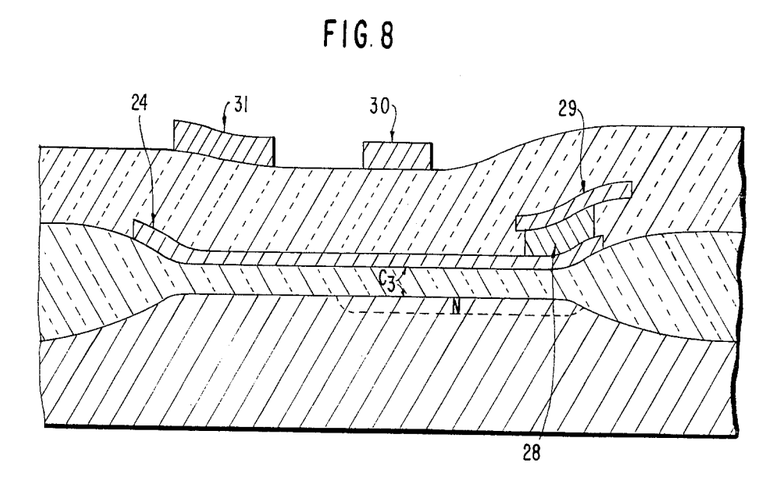
FIG. 8 is a cross-sectional view of the devices shown in FIG. 6E taken along a line X—X.
Figure 9:
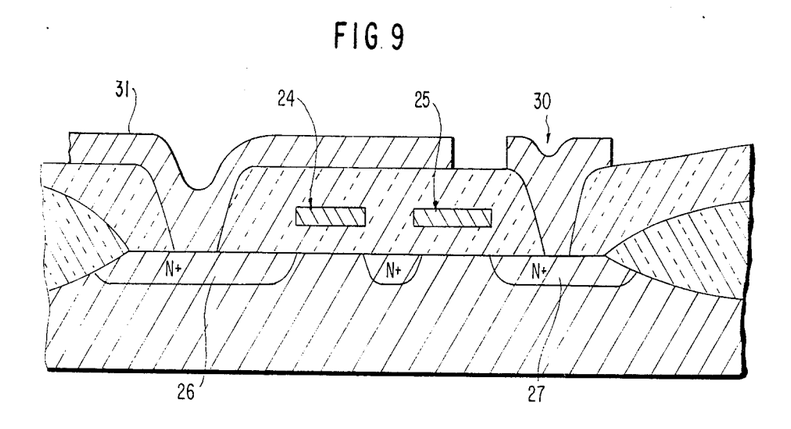
FIG. 9 is a cross-sectional view of the device shown in FIG. 6E taken along a line Y—Y.

Finally, as shown in FIG. 6E, following the deposition and etching of a further layer of insulating oxide, metal lines 30 and 31 are formed to make contact to the drain region 27 of the FET $Q_X$ and the source of the floating gate transistor $Q_{FG}$. FIG. 8 is a cross-sectional view taken along the line X—X in FIG. 6E and FIG. 9 is a cross-sectional view taken along the line Y—Y in FIG. 6E.

As can be readily appreciated at this point, the memory cell and memory device of the invention are particularly advantageous in that a zero to positive charge range can be utilized for programming the floating gate. Hence, smaller cell sizes can be utilized due to the fact that the breakdown voltage for the cell is reduced.

The invention possesses yet further advantages. Particularly, the use of the thin gate oxide layer for the dielectric of the capacitor $C_3$ is advantageous in that the capacitance value of the capacitor $C_3$ can easily be made large. Also, the vertical arrangement of the capacitors $C_1$ and $C_2$ is advantageous in that the largest of the two capacitors is on the bottom where tighter process control can be exercised. This too leads to a reduction in the cell size. A still further advantage is that the program/erase control line never touches a diffusion in the substrate, thereby allowing an even smaller voltage to be applied to the diffusions. For instance, the common diffusion, in a preferred implementation, need have no more than about +10 volts applied thereto.

The use of the dual bit lines is also a unique advantage of the invention. If a single bit line were used, as in some prior art arrangements, a deterioration in the reading performance and a reduction of the effect of threshold window for the floating gate transistor would result. Also, if a single bit line were provided and grounded during the reading operation, the capacitor $C_3$ would act as a Miller-type capacitor which would slow the operation of the device due to its integrating effect.

This completes the description of the preferred embodiments of the invention. Although preferred embodiments have been described, it is believed that numerous alterations and modifications thereto would be apparent to one having ordinary skill in the art without departing from the spirit and scope of the invention.

I claim:

1. A memory array composed of a plurality of memory cells arranged in rows and columns, each of said memory cells comprising:

a first FET having a drain connected to a programming bit line of a row of said array in which said cell is located, a gate of said first FET being connected to a word line for a column of said array in which said cell is located;

a dual gate second FET having a floating gate and a control gate, a drain of said second FET being connected to a source of said first FET, a source of said second FET being connected to a reading bit line for said row of said array in which said cell is located, a first capacitor being formed between said floating gate and the channel of said second FET, a second capacitor being formed between said floating gate and an upper electrode, said upper electrode being coupled to a first control line which is connected in common with upper electrodes of other cells in said array, and a third capacitor being coupled between said floating gate and the interconnected source of said first FET and drain of said second FET.

2. The memory array of claim 1 wherein a dielectric material of said second capacitor comprises DEIS material.

3. The memory array of claim 2 wherein said memory cell is fabricated upon a single semiconductor substrate, and wherein said third capacitor comprises an upper plate formed as an enlarged extension of said floating gate overlying an enlarged common region in said substrate between said first and second FETs and comprising an enlarged lower plate formed by a heavily doped region in said semiconductor substrate, and an oxide layer separating said upper and lower plates of said third capacitor, said oxide layer being the same layer as a gate oxide layer separating said gate of said first FET from said substrate and separating said floating gate of said second FET from said substrate.

4. The memory array of claim 3, wherein said array comprises:

a reading bit line and a separate programming bit line for every row of said array and a single write line for every column of said array;

a third FET for each said reading bit line having a source connected to the corresponding reading bit line, a drain connected to ground and a gate connected to a second control line;

an enhancement mode fourth FET and a depletion mode fifth FET provided for each said programming bit line of said array, said fourth and fifth FETs having interconnected sources and drains with sources connected to the corresponding programming bit line and drains connected to ground, a gate of said fifth FET being connected to ground, and a gate of said fourth FET being connected to a third control line;

sixth and seventh FETs provided for each said row of said array, said sixth and seventh FETs having gates connected to a fourth control line, one of said fourth control lines being provided for each said row of said array;

an eighth FET having a gate connected to a fifth control line, said sixth and eighth FETs being connected in series between a corresponding reading bit line and a sense amplifier;

a data driver circuit comprising a depletion mode ninth FET and an enhancement mode tenth FET connected in series between a sixth control line and ground, a gate of said ninth FET being connected to a common connection point between said ninth and tenth FETs, said common connection point of said ninth and tenth FETs being selectively connected through said seventh FETs to a programming bit line.

5. A method for erasing the memory cells of the memory array of claim 4, comprising the steps of: applying a positive voltage to said second and third control line; and applying a high positive voltage to said first control line.

6. The method of claim 5 wherein said positive high voltage is in a range of 20-24 volts.

7. A method for programming the memory array of claim 4 comprising the steps of: grounding said second, third, and fifth control lines; applying a positive voltage to said gate of a selected pair of said sixth and seventh FETs upon a corresponding selected fourth control line; applying data to a gate of said tenth FET to thereby apply said data through the selected seventh FET to a selected programming bit line; applying a positive voltage to a selected word line; and applying a negative voltage to said first control line.

8. The method of claim 7 wherein said negative voltage applied to said first control line is in a range of $-8$ to $-10$ volts.

9. A method for reading data from said memory array of claim 4 comprising the steps of: applying a positive voltage to a selected word line, a selected fourth control line, and said fifth control line; grounding said first and second control lines; and sensing a conductive state of a selected reading bit line.

* * * * *